United States Patent [19]

Hiramoto

[11] 4,398,094
[45] Aug. 9, 1983

[54] EQUIPMENT AND METHOD FOR ANNEALING SEMICONDUCTORS

[75] Inventor: Tatsumi Hiramoto, Himeji, Japan

[73] Assignee: Ushio Denki Kabushikikaisha, Tokyo, Japan

[21] Appl. No.: 221,762

[22] Filed: Dec. 31, 1980

[30] Foreign Application Priority Data

Jan. 14, 1980 [JP] Japan .................................. 55-2092

[51] Int. Cl.³ ............................................. H01L 21/26
[52] U.S. Cl. ............................ 250/492.1; 219/121 LA
[58] Field of Search .......................... 250/492.1, 504; 219/121 L, 121 LA, 121 LM; 148/1.5

[56] References Cited

U.S. PATENT DOCUMENTS 3,611,191 10/1971 Altman ...................... 219/121 LA
4,151,008 4/1979 Kirkpatrick ................ 219/121 LA
4,298,005 11/1981 Mutzhas ........................ 250/504 R Primary Examiner—Bruce C. Anderson
Attorney, Agent, or Firm—Staas & Halsey

[57] ABSTRACT

A semiconductor is annealed by an equipment which comprises a short-arc type rare gas discharge lamp as a heat source possessing the condition, $140 \geq P \times 1 \geq 16$, where 1 (mm) is the distance between an anode and a cathode and P is the sealed gas pressure (atmospheric pressure) at room temperature (25° C.), an optical system for converging emitted light from the gas discharge lamp in the required manner, a power source unit capable of controlling the emitted light of the gas discharge lamp, and a stage for mounting the semiconductor. With this equipment, the semiconductor crystal is satisfactorily restored from damages incidental to ion implantation and a polycrystalline or amorphous semiconductor is converted into a good single crystal semiconductor.

2 Claims, 4 Drawing Figures

EQUIPMENT AND METHOD FOR ANNEALING SEMICONDUCTORS

BACKGROUND OF THE INVENTION

1. Field of the Invention

The present invention relates to an equipment and a method for annealing semiconductors, in particular, silicon (Si), germanium (Ge), gallium arsenide (GaAs) and so forth.

2. Description of the Prior Art

At present, annealing is drawing the attention of the semiconductor industry in two aspects. One is for the restoration of semiconductor crystals from damages which are caused, for example, by the ion implantation of boron into a silicon wafer by use of high energy with a view to enhancing the performance of a semiconductor element and providing it with a novel function. The most common traditional way of annealing is what is called the electric furnace method, in which the wafer is heated in a furnace, for instance, at 1000° C. for 30 minutes while supplying thereinto dry nitrogen. This method is simple, but it has such defects as follows:

(a) it causes warps in the wafer, thus affecting the productive yield in the ensuing processes;

(b) as heating requires a prolonged time, the interior of the wafer is subject to changes in the ion distribution;

(c) the surface of the wafer is apt to be contaminated; and (d) prolonged time is needed for annealing. In view of these defects, alternatives therefor are now being sought, e.g., by the application of laser rays for brief exposure of the subject thereto. Laser annealing, however, such as in the case of using a pulse-oscillation laser, also has defects:

(e) the distribution of the implanted ions is subject to substantial changes as their diffusion rate is extremely high in the liquid phase, and the crystal restoration is effected because of the fusion of the wafer surface and the achievement of its crystallization through the liquid epitaxial growth; and (f) because the radiated light is of a single wavelength, an interference pattern occurs in the melting area, leading to uneven irradiation on the wafer. In the case of employing a continuous oscillation laser, (g) it means the scanning of a small beam spot on the wafer and thus has defects such as producing a portion wanting sufficient annealing in the linear boundaries between scanning lines, and if the space between the scanning lines is reduced, the scanning takes a prolonged time and often yields overheated portions, thus causing such a disadvantage as uneven irradiation; and (h) because of the laser light being of a single wavelength an interference pattern is developed on the wafer surface to cause uneven irradiation. A common defect of all of the laser ray annealing methods is the fact they call for large and precise equipments and further advanced techniques for operation.

Another annealing method is for producing, for instance, a silicon wafer by the epitaxial growth of a silicon layer which is deposited on a suitable substrate by means of an ion evaporation technique. The annealing, in such a case, too, was hitherto performed in the same manner as above mentioned, that is, in an electric furnace, or by exposing the wafer to the laser ray, and had the same defects as previously mentioned.

SUMMARY OF THE INVENTION

The present invention is to provide a novel equipment and a method for annealing semiconductors.

According to the present invention, the semiconductor annealing equipment comprises a short-arc type rare gas discharge lamp as a heat source which satisfies the condition, $140 \geq P \times l \geq 16$, where $l$ (mm) is the inter-electrode distance and P is the sealed gas pressure (atmospheric pressure) at room temperature, an optical system for converging radiated light from the short-arc type rare gas discharge lamp to irradiate the surface of a semiconductor, a power source unit for controlling the intensity of the radiated light from the short-arc type rare gas discharge lamp, and a stage for mounting thereon the semiconductor. With the semiconductor annealing method of the present invention, a semiconductor is heated by applying to its surface an energy of 45 joules/cm² or more with the radiated light having a wavelength in the range of 2000 to 12000Å through the use of the abovesaid equipment.

DESCRIPTION OF THE PREFERRED EMBODIMENTS

Figure 1:
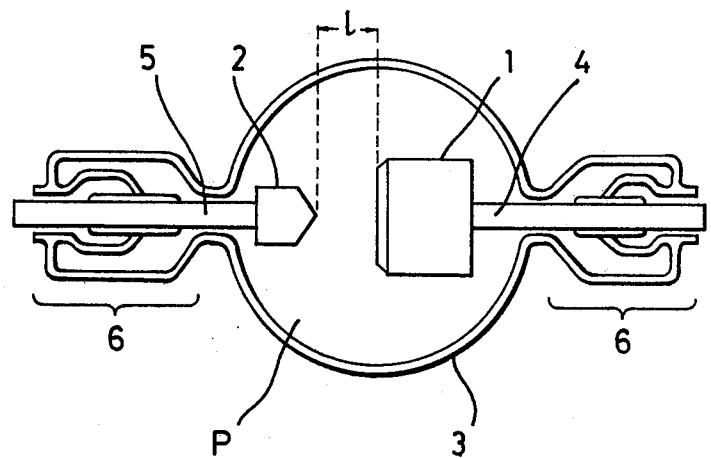
FIG. 1 is a schematic diagram explanatory of a short-arc type rare gas discharge lamp for the practice of the present invention.
Figure 2:
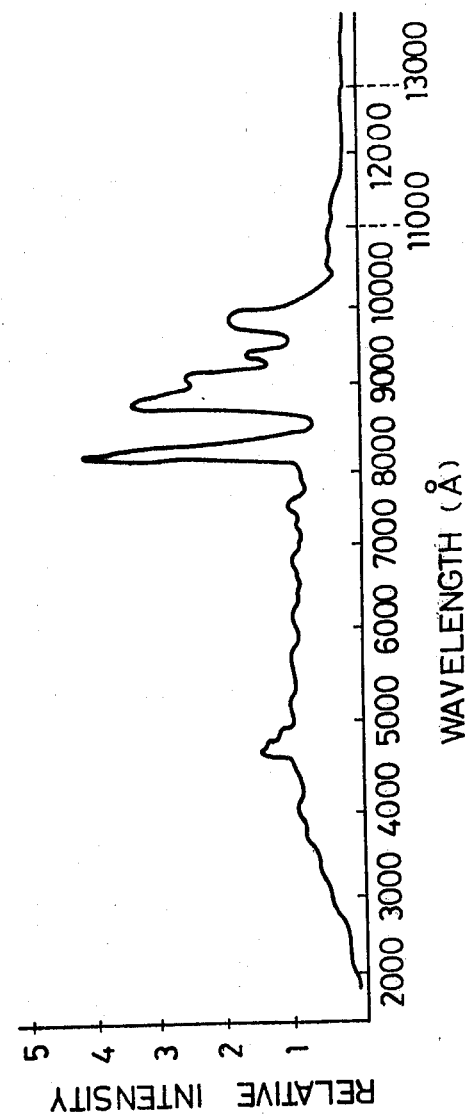
FIG. 2 is a graph showing the spectral characteristic of the discharge lamp of FIG. 1.

FIG. 1 illustrates a short-arc type rare gas discharge lamp employed in the method of the present invention. Reference numeral 1 indicates an anode; 2 designates a cathode; l identifies the distance between both of the electrodes 1 and 2; 3 denotes a quartz bulb surrounding both electrodes; 4 and 5 represent conductive rods for the anode 1 and the cathode 2, respectively; and 6 shows hermetic sealed portions. The interior of the quartz bulb 3 is filled with xenon gas under an atmospheric pressure P (at 25° C.). The short-arc type rare gas discharge lamp of this kind has already been placed on the market by Ushio Denki Kabushiki Kaisha and others under the trade name of UXL. This discharge lamp has such a spectral emissive characteristic as shown in FIG. 2 in which it emits intense having wavelengths ranging from 2000 to 12000 Å. By combining this discharge lamp with an elliptic converging mirror or paraboloidal mirror so that a spot of high brightness which is produced near the tip of the cathode may lie at the focal position of the abovesaid mirror, the emitted light from the discharge lamp can be directed towards the subject with high efficiency.

Figure 3:
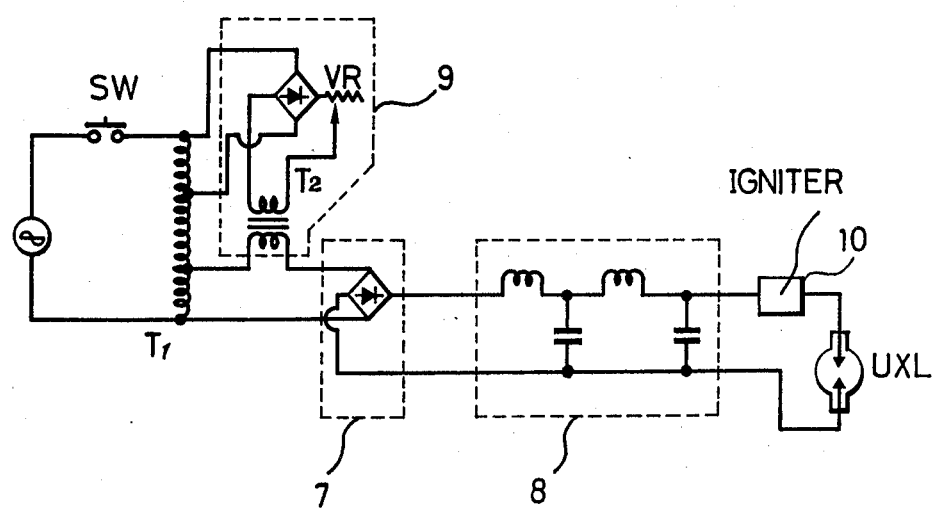
FIG. 3 is a circuit diagram explanatory of a power source unit capable of controlling the intensity of radiated light of the discharge lamp shown in FIG. 1.

Control of the intensity of the emitted light is relatively simple and can be achieved accurately. FIG. 3 shows an example of a power source unit for controlling the light intensity, in which an AC power supply is connected via a switch SW to a main transformer $T_1$ and then connected to the discharge lamp UXL via a rectifier 7 and a smoothing circuit 8. In this case, a controller 9, including a control transformer $T_2$ and a variable resistor VR, is provided at the stage preceding the rectifier 7 for variable control of a current flowing therein by which the intensity of the emitted light from the discharge lamp UXL can easily be adjusted. In FIG. 3, reference numeral 10 indicates a high-voltage igniter for firing the discharge lamp UXL.

As for the semiconductor wafer, since it has a large absorption coefficient over a wavelength range of 2000 to 12000 Å, the emitted light from the discharge lamp is absorbed mostly by the surface layer of the semiconductor wafer, so that the surface layer is heated in a short time, providing convenience in its annealing. In addition, since the emitted light forms a continuous spectrum, it prevents nonuniform irradiation of the semiconductor wafer by the emitted light due to light interference. Further, since the intensity control of the emitted light is easily conducted as stated above, the semiconductor crystal of the wafer can be restored from damages without melting the wafer surface, that is, in the solid phase state, whereby variations of the distribution of the implanted ions can also be inhibited.

In short, conformity between the nature of the semiconductor wafer and the nature of the short-arc type rare gas discharge lamp leads to the conclusion that the short-arc type rare gas discharge lamp is an excellent heat source for annealing the semiconductors.

Figure 4:
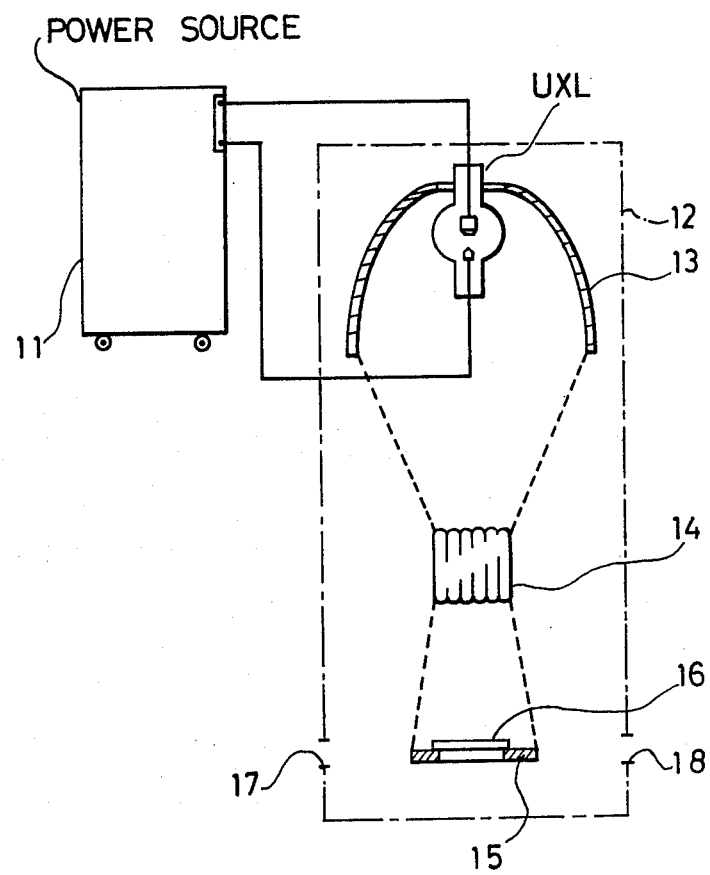
FIG. 4 is a schematic diagram illustrating an embodiment of the equipment of the present invention.

FIG. 4 schematically illustrates the equipment of the present invention. Reference numeral 11 indicates a power source unit; such as that illustrated in FIG. 3 and described earlier and 12 designates a container, in which are mounted a short-arc type rare gas discharge lamp UXL, such as that illustrated in FIG. 1, an elliptic converging mirror 13, an integrator lens 14 and a stage 15, all using appropriate support means. A semiconductor wafer 16 is placed on the stage 15. The semiconductor wafer 16 may be moved in and out of the container 12 on the stage 15. Accordingly, the container 12 is provided with an entrance 17 to admit the stage 15 and the wafer 16 resting thereon and an exit 18 to taken them out.

A 1-inch-diameter silicon wafer having implanted therein arsenic to an amount of $10^{14}$ atoms/cm$^2$ has a sheet resistance which is virtually infinitely great due to crystal damage. With the abovesaid equipment, when such a wafer is annealed by simultaneously exposing the entire area of its surface to light of a xenon short-arc discharge lamp (with conditions of power consumption: 10 KW, P:7 and l:8) for three seconds, the sheet resistance of the wafer becomes $3 \times 10^2$ ohms. This indicates that the crystal damage is cured in a very short time. In this case, the light intensity on the silicon wafer was 700 joules/cm$^2$ in total energy in the range of the wavelengths over 2000 to 12000 Å. Another experiment proved, however, that the light intensity on the silicon wafer was enough if it was, at a minimum, 45 joules/cm$^2$ in total energy in the abovesaid wavelength range. With the values of energy below this value, any change in the sheet resistance was not recognizable, indicating that, as the result, the crystal recovery failed to develop.

It is therefore best to design the value of $P \times l$ to be $140 \geq P \times l \geq 16$. With the value larger than 140, the instability of the arc in the gas discharge lamp is unavoidable and particularly, there is the fear that the wavering of the beam spot that develops near the extreme end of the cathode comes off the converging optical system. Such phenomenon is extremely undesirable as it directly affects the intensity of the light applied on the silicon wafer in terms of time and position, resulting in the crystal recovery becoming uneven at various points on the wafer. Where the value $P \times l$ is less than 16, the radiation efficiency of the gas discharge lamp (i.e., efficiency of converting electric energy into optical energy) is low and it is also not economical.

As has been described in the foregoing, the present invention, by applying the common requirements and characteristics of the semi-conductor wafer and the short-arc type rare gas discharge lamp as stated above, is to provide a novel semiconductor annealing equipment and method which substantially eliminate the defects as hitherto found in the traditional semiconductor annealing technology; thus, it cannot but greatly contribute to the development of the semiconductor industry.

It will be apparent that many modifications and variations may be effected without departing from the scope of the novel concepts of this invention.

What is claimed is:

1. A (semiconductor annealing) equipment comprising:
   (a) a short-arc type rare gas discharge lamp having an anode, cathode, and a sealed gas pressure with the condition, $140 \geq P \times l \geq 16$, where l (mm) is the distance between the anode and cathode and P is the sealed gas pressure (atmospheric pressure) at room temperature (25° C.);
   (b) optical means for converging emitted light from the short-arc type rare gas discharge lamp to irradiate the surface of a semiconductor;
   (c) power source means for controlling the intensity of the emitted light of the short-arc type rare gas discharge lamp; and
   (d) a stage for mounting the semiconductor to be irradiated by the lamp.

2. A method for annealing a semiconductor by applying to its surface irradiated light ccomprising the steps of: (a) mounting a semiconductor onto a stage; (b) emitting light of a wavelength in the range of 2000 to 12000 Å from a short-arc type rare gas discharge lamp which possesses the condition, $140 \geq P \times l \geq 16$, where l (mm) is the distance between an anode and a cathode and P is the sealed gas pressure (atmospheric pressure) at room temperature (25° C.); (c) converging the emitted light from the short-arc type rare gas discharge lamp through optical means to irradiate the surface of the stage-mounted semiconductor; and (d) controlling the intensity of the emitted light of the short-arc type rare gas discharge lamp to apply an energy of 45 joules/cm$^2$ or more of the emitted light to the surface of the semiconductor.

* * * * *

UNITED STATES PATENT AND TRADEMARK OFFICE
CERTIFICATE OF CORRECTION

PATENT NO. : 4,398,094

DATED : Aug. 9, 1983

INVENTOR(S) : Hiramoto

Page 1 of 2

It is certified that error appears in the above-identified patent and that said Letters Patent is hereby corrected as shown below:

Front page, [56] References Cited:
    "Altman" should be --Altman et al.--;

Front page, [57] Abstract:
    line 3, "P×1" should be --P×ℓ--;
    line 4, "1" should be --ℓ--;
    line 8, "in the required manner" should be --to the semiconductor--;
    line 10, "lamp," should be --lamp in the required manner,--.

Column 1, line 48, delete "(g)" and make "it means the scanning . . . " part of previous paragraph;
Column 1, line 49, after "such as" insert --:-- and change "producing" to [begin new paragraph] --(g) producing--;
Column 1, line 56, after "length" insert --,--.
Column 2, line 8, "1" should be --ℓ-- (both occurrences);
Column 2, line 40, "1" should be --ℓ--.
Column 3, line 27, after "unit" change ";" to --,--;
Column 3, line 28, after "earlier" insert --;--;
Column 3, line 46, "1" should be --ℓ--;
Column 3, line 59, "1" should be --ℓ--;
Column 3, line 63, "1" should be --ℓ--.
Column 4, line 9, "1" should be --ℓ--;
Column 4, line 27, delete "(" and ")";
Column 4, line 32, "P×1" should be --P×ℓ--; "1(mm)" should be --ℓ(mm)--;

UNITED STATES PATENT AND TRADEMARK OFFICE
CERTIFICATE OF CORRECTION

PATENT NO. : 4,398,094

DATED : Aug. 9, 1983

INVENTOR(S) : Hiramoto

It is certified that error appears in the above-identified patent and that said Letters Patent is hereby corrected as shown below:

Column 4, line 49, "P×1" should be --P×$\ell$--; "1(mm)" should be --$\ell$(mm)--.

Signed and Sealed this

Twelfth Day of March 1985

[SEAL]

Attest:

DONALD J. QUIGG

Attesting Officer — Acting Commissioner of Patents and Trademarks